United States Patent
Cohen et al.

(10) Patent No.: US 9,329,935 B2
(45) Date of Patent: May 3, 2016

(54) METHOD TO DYNAMICALLY UPDATE LLRS IN AN SSD DRIVE AND/OR CONTROLLER

(71) Applicant: Seagate Technology LLC, Cupertino, CA (US)

(72) Inventors: Earl T. Cohen, Cupertino, CA (US); Yu Cai, San Jose, CA (US); Erich F. Haratsch, San Jose, CA (US); Yunxiang Wu, Cupertino, CA (US)

(73) Assignee: Seagate Technology LLC, Cupertino, CA (US)

( * ) Notice: Subject to any disclaimer, the term of this patent is extended or adjusted under 35 U.S.C. 154(b) by 127 days.

(21) Appl. No.: 14/280,884

(22) Filed: May 19, 2014

(65) Prior Publication Data

US 2015/0331748 A1   Nov. 19, 2015

(51) Int. Cl.
*H03M 13/00* (2006.01)
*H03M 13/03* (2006.01)
*G06F 11/10* (2006.01)
*H03M 13/39* (2006.01)

(52) U.S. Cl.
CPC ....... *G06F 11/1076* (2013.01); *H03M 13/3927* (2013.01)

(58) Field of Classification Search
CPC .............. H03M 13/3905; H03M 13/1102; H03M 13/1111; H03M 13/3927; G06F 11/1048; G06F 11/076; G06F 11/1012; G06F 11/3466; G11C 29/42
USPC ......... 714/758, 759, 760, 794, 724, 745, 763, 714/773, 48, 52, 54
See application file for complete search history.

(56) References Cited

U.S. PATENT DOCUMENTS

| | | | | |
|---|---|---|---|---|
| 8,086,928 B2 * | 12/2011 | Jalloul | ............... | H03M 13/2975 714/752 |
| 8,250,437 B2 * | 8/2012 | Sakurada | ........... | G11C 11/5642 714/764 |
| 8,429,501 B2 | 4/2013 | Tseng et al. | ................... | 714/773 |
| 8,510,637 B2 | 8/2013 | Tseng et al. | ................... | 714/773 |
| 8,595,601 B2 | 11/2013 | Kim et al. | ...................... | 714/780 |
| 8,640,002 B1 | 1/2014 | Varanasi et al. | ............... | 714/758 |
| 2011/0083060 A1 * | 4/2011 | Sakurada | ........... | G11C 11/5642 714/763 |
| 2013/0173985 A1 | 7/2013 | Chung et al. | ................... | 714/755 |
| 2013/0318422 A1 | 11/2013 | Weathers et al. | ............. | 714/780 |
| 2013/0326314 A1 | 12/2013 | Choi et al. | ..................... | 714/780 |
| 2014/0040704 A1 | 2/2014 | Wu et al. | ......................... | 714/773 |
| 2014/0082458 A1 | 3/2014 | Kim et al. | ...................... | 714/764 |
| 2014/0108883 A1 | 4/2014 | Tehrani et al. | ................ | 714/758 |
| 2014/0112076 A1 | 4/2014 | Ish-Shalom et al. | ..... | 365/185.18 |
| 2014/0281823 A1 * | 9/2014 | Micheloni | ........... | G06F 11/1012 714/773 |

\* cited by examiner

*Primary Examiner* — Christine Tu
(74) *Attorney, Agent, or Firm* — Christopher P. Maiorana, PC

(57) ABSTRACT

An apparatus comprising a memory and a controller. The memory may be configured to process a plurality of read/write operations. The memory comprises a plurality of memory units each having a size less than a total size of the memory. The controller may be configured to perform a first error correction code decoding on the memory units using a plurality of initial log likelihood ratio values. The controller may be configured to count a number of unsatisfied checks if the first error correction code decoding fails. The controller may be configured to generate a plurality of measured log likelihood ratio values if the number of unsatisfied checks is below a threshold. The plurality of measured log likelihood ratio values are (a) based on calculations using decoded bits of the first error correction code decoding, and (b) used to perform a second error correction code decoding on the memory units.

18 Claims, 7 Drawing Sheets

METHOD TO DYNAMICALLY UPDATE LLRS IN AN SSD DRIVE AND/OR CONTROLLER

FIELD OF THE INVENTION

The invention relates to data storage generally and, more particularly, to a method and/or apparatus for implementing dynamically updating LLRs in an SSD drive and/or controller.

BACKGROUND

Due to aggressive process scaling, the raw bit error rate (BER) of NAND flash is becoming poorer and poorer. To maintain the same level of reliability, solid state drive (SSD) controllers are adopting error correction codes with soft decoding capability. For example, low density parity check (LDPC) codes have soft decoding capability. Error correction codes with soft decoding capability are more powerful in correcting errors but they use a soft input to the decoder. The soft input is in the form of a log likelihood ratio (LLR). Since conventional flash devices do not provide soft decision outputs, SSD controllers have to generate them using either hardware or software. Generating high quality LLRs is important for decoding results. There are many ways to generate LLRs. A simple and practical way is to pre-define LLR lookup tables (LUT) for different numbers of read retries. However, the distributions of LLRs can significantly change based on factors such as the number of program/erase cycles, retention, and read disturb.

It would be desirable to implement a method for dynamically generating LLRs for error recovery when predefined LLRs are suspected to be inaccurate.

SUMMARY

The invention concerns an apparatus comprising a memory and a controller. The memory may be configured to process a plurality of read/write operations. The memory comprises a plurality of memory units each having a size less than a total size of the memory. The controller may be configured to perform a first error correction code decoding on the memory units using a plurality of initial log likelihood ratio values. The controller may be configured to count a number of unsatisfied checks if the first error correction code decoding fails. The controller may be configured to generate a plurality of measured log likelihood ratio values if the number of unsatisfied checks is below a threshold. The plurality of measured log likelihood ratio values are (a) based on calculations using decoded bits of the first error correction code decoding, and (b) used to perform a second error correction code decoding on the memory units.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the invention include providing a method of dynamically updating LLRs for SSDs that may (i) perform error recovery, (ii) treat a number of erroneous bits as if they are correct to measure LLR values, (iii) dynamically generate LLR values to accommodate the time-varying property of a flash channel, (iv) use decoded results as genie data, (v) reduce uncorrectable errors, (vi) perform measurements using a LLR histogram, (vii) build a histogram based on multiple pages, and/or (viii) be implemented as one or more integrated circuits.

Although cell voltage is continuous, flash devices only provide a binary sequence (e.g., hard decisions) after a read operation. When soft decoding processes are used for error correction, the hard decisions are often converted into LLRs. The LLRs are then fed to the decoder as input. The LLRs converted from a single read may not be of high enough quality to use for successful decoding. In such a case, multiple reads with varying read voltages are needed to obtain more information from the channel. For MLC channels, the LLR is a function of the four charge-state distributions (e.g., means and variances) and the read reference voltages (e.g., Vrefs). Generating high quality LLRs may be important to decode results.

There are many methods to generate LLRs. A simple and practical method may be to pre-define LLR lookup tables (LUT) for different numbers of read retries. The value of LLRs in the LUTs may be obtained by offline measurement. Generally, LLRs change with program and erase cycles (e.g., PEC). Other factors, such as retention and/or read disturb may significantly change the voltage distributions. Different LLR LUTs may be needed when the voltage distributions change.

Embodiments of the invention provide an error recovery method especially suitable for handling a LDPC error floor with a decoding failure caused by trapping sets. When a decoding failure is caused by trapping sets there may only be a few erroneous bits left in the decoded result. One method to check if the decoding error is caused by trapping sets may be to determine a number of unsatisfied checks. For example, a LDPC code may be represented by a matrix having a size of M×N. Each row of the matrix may represent a check. When ECC decoding is successful, all the row equations of the matrix may be satisfied. When ECC decoding is unsuccessful, some, or all, of the row equations may not satisfied. The number of unsatisfied row equations may be the number of unsatisfied checks. For a particular range, a number of decoded bit errors may have a positive correlation to the number of unsatisfied checks.

A small number of erroneous bits may be treated as if they are correct. LLR values may be measured with the decoded bits (e.g., decoded bits having a small number of errors) since the small number of erroneous bits may not significantly change cell voltage distributions.

Figure 1:
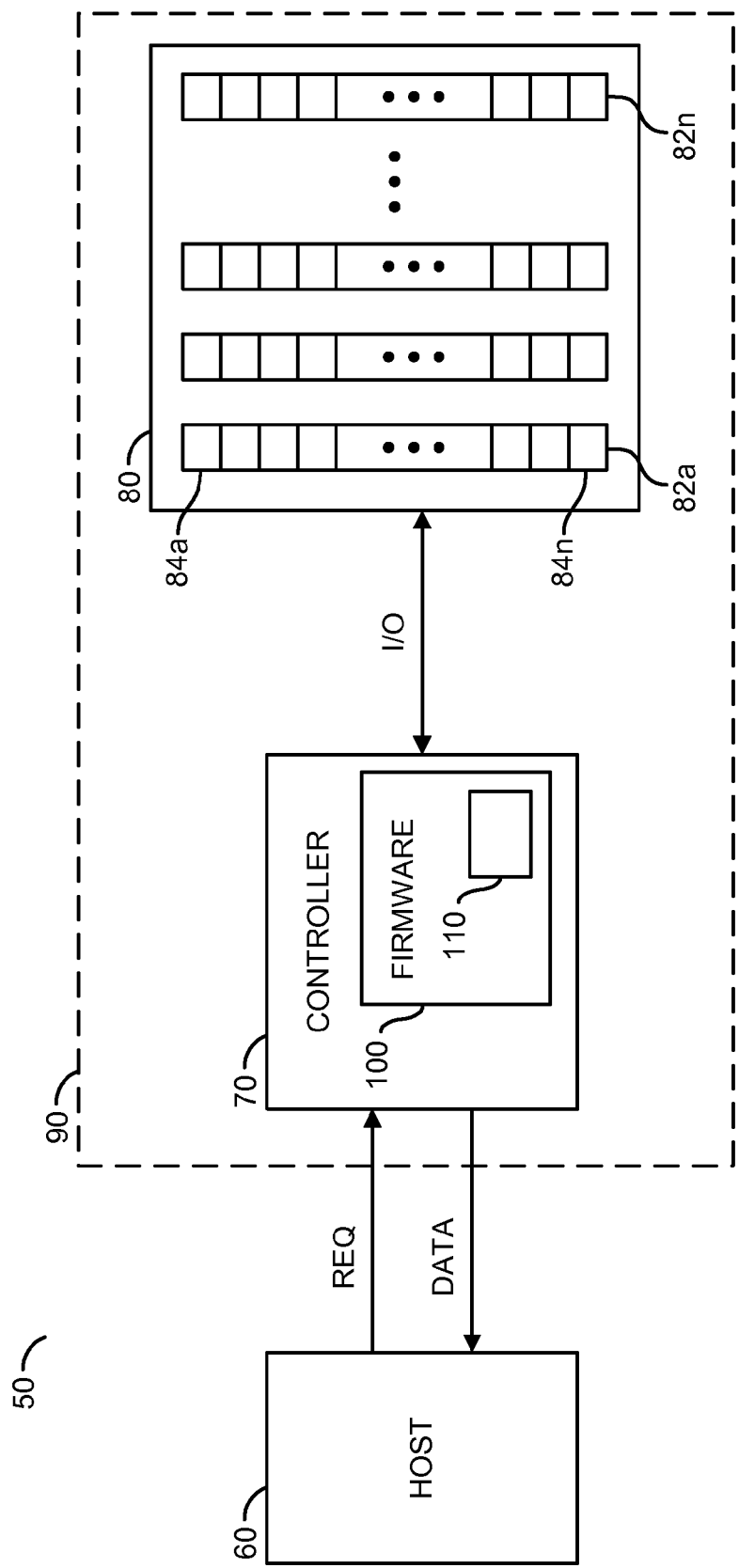
FIG. 1 is a diagram illustrating an example embodiment.

Referring to FIG. 1, a block diagram of an example apparatus 50 is shown. The apparatus 50 generally comprises a block (or circuit) 60, a block (or circuit) 70 and a block (or circuit) 80. The circuit 70 may include a circuit 100. The circuit 100 may be a memory/processor configured to store computer instructions (or firmware) or may be logic. The instructions, when executed, may perform a number of steps. The firmware 100 may include a redundancy control module 110. The redundancy control module 110 may be implemented as part of the firmware 100 or as a separate module. While an example of redundancy implemented in the firmware 100 is shown, the redundancy may be implemented, in another example, in hardware (e.g., logic such as a state machine).

A signal (e.g., REQ) may be generated by the circuit 60. The signal REQ may be received by the circuit 70. The signal REQ may be a request signal that may be used to access data from the circuit 80. A signal (e.g., I/O) may be generated by the circuit 70 to be presented to/from the circuit 80. The signal REQ may include one or more address bits. A signal (e.g., DATA) may be one or more data portions received by the circuit 60.

The circuit 60 is shown implemented as a host circuit. The circuit 70 reads and writes data to and from the circuit 80. The circuit 80 is generally implemented as a nonvolatile memory circuit. The circuit 80 may include a number of modules 82a-82n. The modules 82a-82n may be implemented as NAND flash chips. In some embodiments, the circuit 80 may be a NAND flash device. In other embodiments, the circuit 70 and/or the circuit 80 may be implemented as all or a portion of a solid state drive 90 having one or more nonvolatile devices. The circuit 80 is generally operational to store data in a nonvolatile condition. When data is read from the circuit 80, the circuit 70 may access a set of data (e.g., multiple bits) identified in the signal REQ. The signal REQ may request data from the drive 90 or from one of a number of additional storage devices.

Data within the circuit 80 is generally organized in a hierarchy of units, such as die, plane, block, and/or page units. The circuit 80 may contain multiple dies (e.g., in a single package or multiple packages). Generally, for enterprise applications the circuit 80 may be comprised of hundreds of flash memory dies. Flash memory may have multiple planes in the same die. The planes may be accessed in parallel to improve performance.

A first type of redundancy may be implemented as a redundancy block. A redundancy block is a combination of blocks (e.g., a block from each nonvolatile memory die in the circuit 80) that can be combined to form a redundant array of silicon independent elements, similar to a redundant array of independent disks for magnetic media. The nonvolatile memory locations within the blocks may be written in a striped fashion. In some embodiments, organizing a plurality of blocks in redundancy blocks reduces an overhead of block management. A block is generally considered a smallest quantum of erasing. A page is generally considered a smallest quantum of writing. A read unit (or codeword or Epage or ECC-page) is a smallest correctable quantum of reading and/or error correction. Each block includes an integer number of pages. Each page includes an integer number of read units.

In some embodiments, the circuit 80 may be implemented as a single-level cell (e.g., SLC) type circuit. A SLC type circuit generally stores a single bit per memory cell (e.g., a logical 0 or 1). In other embodiments, the circuit 80 may be implemented as a multi-level cell (e.g., MLC) type circuit. A MLC type circuit is generally capable of storing multiple (e.g., two) bits per memory cell (e.g., logical 00, 01, 10 or 11). In still other embodiments, the circuit 80 may implement a triple-level cell (e.g., TLC) type circuit. A TLC circuit may be able to store multiple (e.g., three) bits per memory cell (e.g., a logical 000, 001, 010, 011, 100, 101, 110 or 111). In yet another embodiment, the circuit 80 may implement a circuit with a cell level greater than a triple-level cell. Generally, the circuit 80 may be implemented as a n-level cell capable of storing n-bits per memory cell.

In general, the controller 70 may include an erase/program unit that may implement redundancy across the modules 82a-82n. For example, multiple blocks may be read from multiple dies 82a-82n. The erase/program unit may be implemented as part of the firmware (or logic) 100.

The drive 90 may contain, in one example, multiple NAND Flash or memory modules 82a-82n. Each of the memory modules may be fabricated as one or more dies (e.g., 1, 2, 4, 8, etc.). The dies (or modules) 82a-82n may operate to read or to write concurrently. The read and write bandwidth depends on how many of the dies 82a-82n are implemented, as well as the bandwidth of each of the dies 82a-82n. Each of the dies 82a-82n may contain a plurality of planes. Each of the planes of the dies 82a-82n may contain a plurality of blocks 84a-84n. The blocks 84a-84n of the planes of one of the dies 82a-82n may be accessed in parallel. If the SSD 90 receives the host command REQ, in order to achieve the best performance, and/or to address wear leveling issues, the drive 90 will walk through all of the dies 82a-82n (e.g., a first page of DIE0, DIE1 . . . DIEn, then a next page of DIE0).

Figure 2:
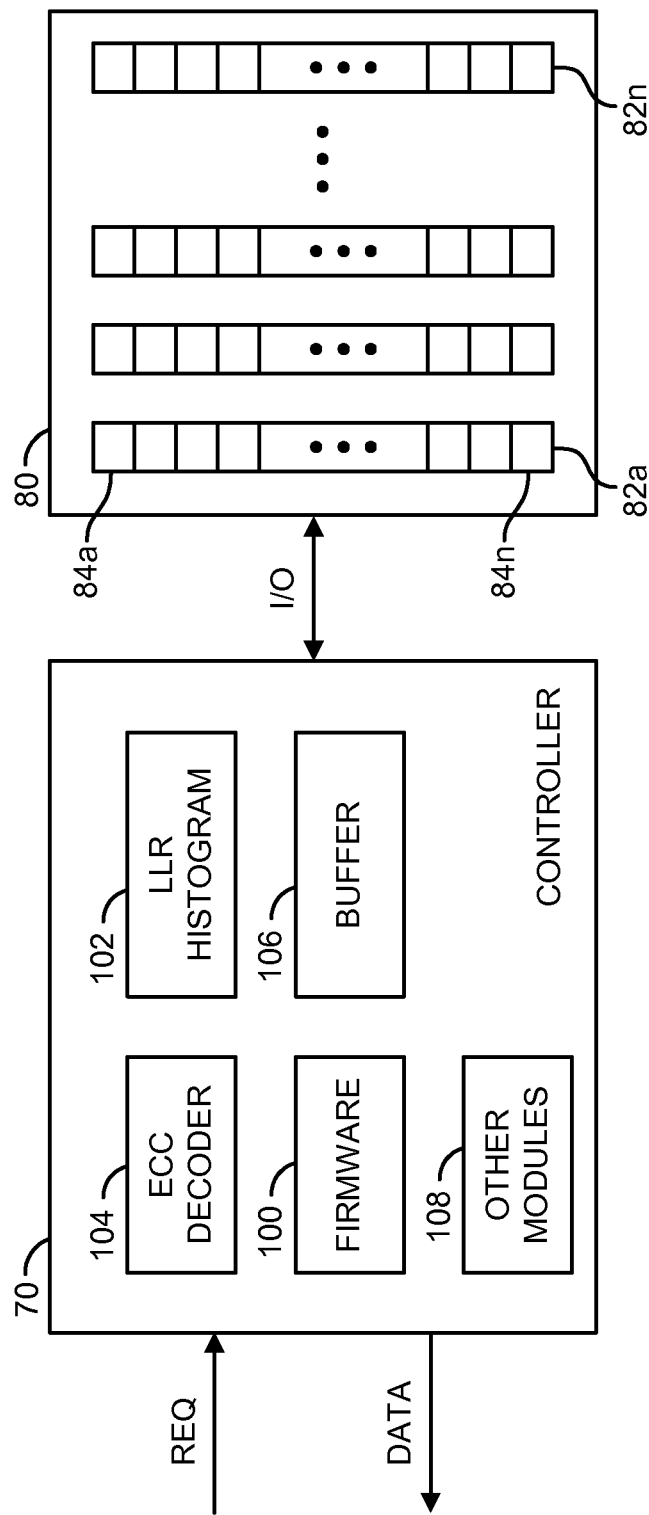
FIG. 2 is a diagram illustrating a more detailed embodiment.

Referring to FIG. 2, a diagram illustrating a more detailed embodiment is shown. The controller 70 is shown connected to the memory circuit 80. The controller 70 generally comprises the firmware 100, a block (or circuit) 102, a block (or circuit) 104, a block (or circuit) 106, and a block (or circuit) 108. The circuit 102 may be a LLR histogram. The circuit 104 may be an ECC decoder. The circuit 106 may be a buffer. The circuit 108 may represent other modules.

The ECC decoder 104 may be configured to perform error correction code decoding with soft decoding capability. Generally, the ECC decoder 104 is implemented using digital circuits. For example, the decoder 104 may be configured to decode low density parity check codes. Error correction codes with soft decoding capability may need soft input in the form of LLRs. The ECC decoder may have an input precision (e.g., 4-bits, 3-bits, etc.).

The LLR histogram 102 may store decision pattern histograms. The LLR histogram 102 may be configured to implement LLR LUTs. The controller 70 may read a page. After a page read, there may be a decision pattern for each cell of the page. The occurrences of decision patterns may be counted. A histogram may be obtained from the decision patterns. Histogram data stored in the LLR histogram 102 may be used as genie data (e.g., decoded bits of error correction code decoding). The LLR histogram 102 may progressively gain knowledge of voltage distributions during retry reads. Using the updated knowledge, the LLR values used for successive reads may be optimized. In some embodiments, the LLR histogram 102 may store histogram data based on multiple pages. The histogram data may be aggregated as more pages are read. In some embodiments, the firmware 100 may collect LLR histogram statistics. For example, the LLR histogram 102 may be implemented in the firmware 100. In another example, the LLR histogram 102 may be implemented in hardware (e.g., logic such as a state machine).

The controller 70 may generate LLRs. Generally, generating LLRs involves two steps. First, the desired read reference voltages are set based on the criterion of maximizing mutual information. Second, the LLRs are either generated by calculation if cell voltage distributions are known, or measured when read back data is available.

Figure 3:
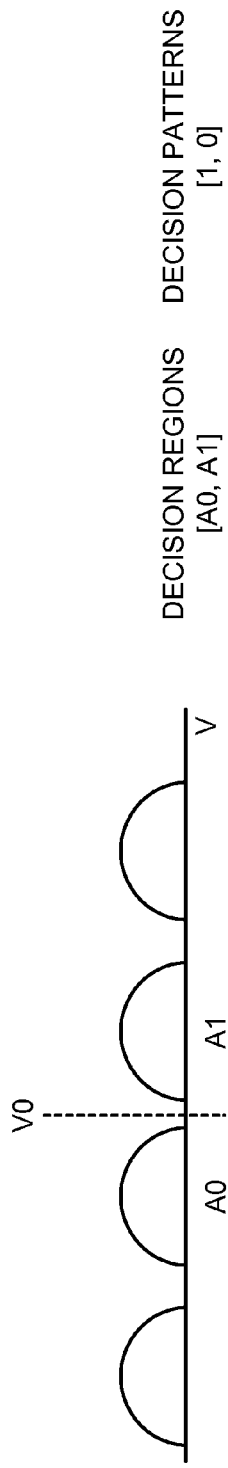
FIG. 3 is a diagram illustrating read reference voltages and decision regions when reading a single voltage.

Referring to FIG. 3, a diagram illustrating read reference voltages and decision regions when reading a single voltage is shown. The read reference voltages (e.g., Vrefs), decision regions, and the corresponding decision patterns when the least-significant bit (LSB) pages of the MLC flash are read are shown. Four voltage distributions from left to right may be mapped to "11", "01", "00" and "10", respectively. For an example of reading a single voltage (e.g., V0), the voltage axis (e.g., the horizontal axis V) is divided into two decision regions (e.g., A0, and A1). Corresponding decision patterns may be 1 for the region A0, and 0 for the region A1. Soft decisions corresponding to 0 or 1 may be obtained if the four distribution parameters are considered. The soft decision with a single read is a fairly rough approximation. A higher quality of soft decisions may be obtained with more reads.

Figure 4:
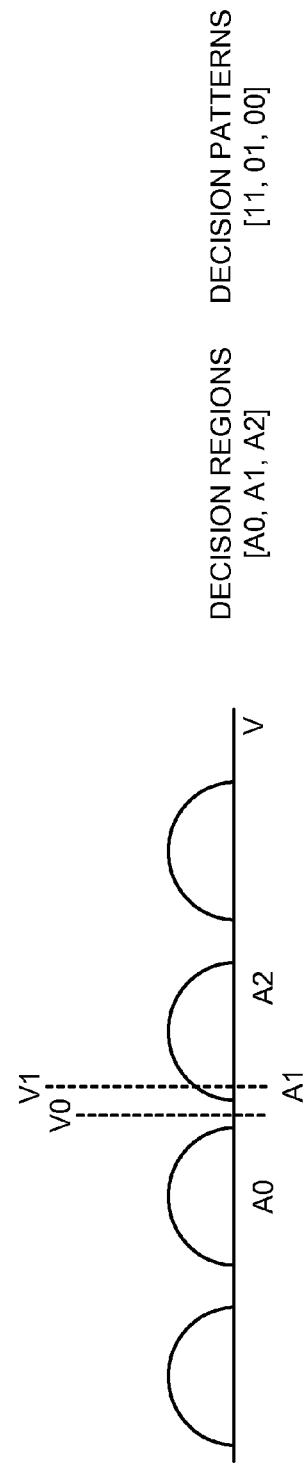
FIG. 4 is a diagram illustrating read reference voltages and decision regions when reading two voltages.

Referring to FIG. 4, a diagram illustrating read reference voltages and decision regions when reading two voltages is shown. The read reference voltages (e.g., Vrefs), decision regions, and the corresponding decision patterns when LSB pages of MLC flash are read are shown. Four voltage distributions from left to right may be mapped to "11", "01", "00" and "10", respectively. For an example of reading two voltages (e.g., V0, and V1), the voltage axis (e.g., the horizontal axis V) is divided into three decision regions (e.g., A0, A1, and A2). Corresponding decision patterns may be 11 for the region A0, 01 for the region A1, and 00 for the region A2.

Figure 5:
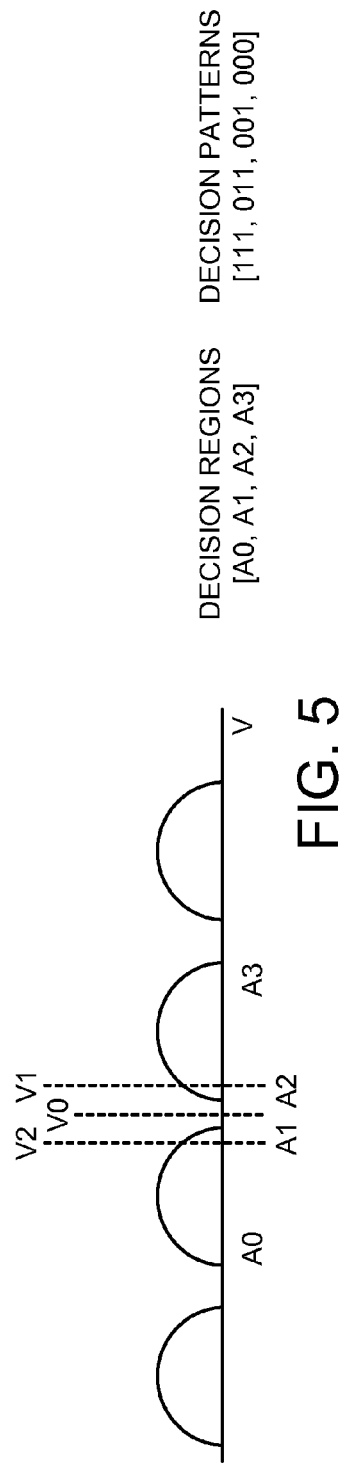
FIG. 5 is a diagram illustrating read reference voltages and decision regions when reading three voltages.

Referring to FIG. 5, a diagram illustrating read reference voltages and decision regions when reading three voltages is shown. The read reference voltages (e.g., Vrefs), decision regions, and the corresponding decision patterns when LSB pages of MLC flash are read are shown. Four voltage distributions from left to right may be mapped to "11", "01", "00" and "10", respectively. For an example of reading three voltages (e.g., V0, V1, and V2), the voltage axis (e.g., the horizontal axis V) is divided into four decision regions (e.g., A0, A1, A2, and A3). Corresponding decision patterns may be 111 for the region A0, 011 for the region A1, 001 for the region A2, and 000 for the region A3.

A read operation of a NAND flash device (e.g., the memory 80) may include a process for applying threshold detection. Implementing multiple reads with varying read threshold voltages is equivalent to applying multiple threshold detection operations. The cell voltage is quantized into more than two regions leading to more than two decision patterns, as shown in FIG. 4 and FIG. 5. The decision patterns are hard decisions. A soft decision may be calculated corresponding to each decision pattern. The soft decisions are usually in the form of LLR values.

Generally, the number of decision patterns for N reads of a lower page (e.g., a LSB page) is N+1. Generally, for a most-significant bit (e.g., MSB) page with conventional Gray coding, there may be a maximum of 2*N hard decision patterns. For example, a pair of read voltages is used for each read operation.

Figure 6:
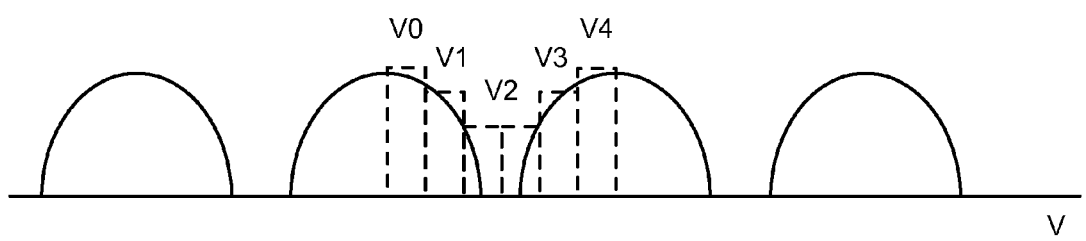
FIG. 6 is a diagram illustrating an example of a histogram reading.

Referring to FIG. 6, a diagram illustrating an example of a histogram reading is shown. The controller 70 may read a page of the memory 80. After reading a page, there may be a decision pattern for each cell of the page. For example, a histogram of reading LSB pages with five different read voltages (e.g., V0, V1, V2, V3, and V4) are shown. Generally, the read voltage values may be set to maintain an optimal uncorrectable BER. A first bin (e.g., decision region) may count a number of the decision patterns corresponding to a cell voltage less than V0. A fifth bin may count a number of decision patterns corresponding to a cell voltage greater than V4 (e.g., the rightmost region). A height of a bin may be the number of decision patterns associated with each bin.

Figure 7:
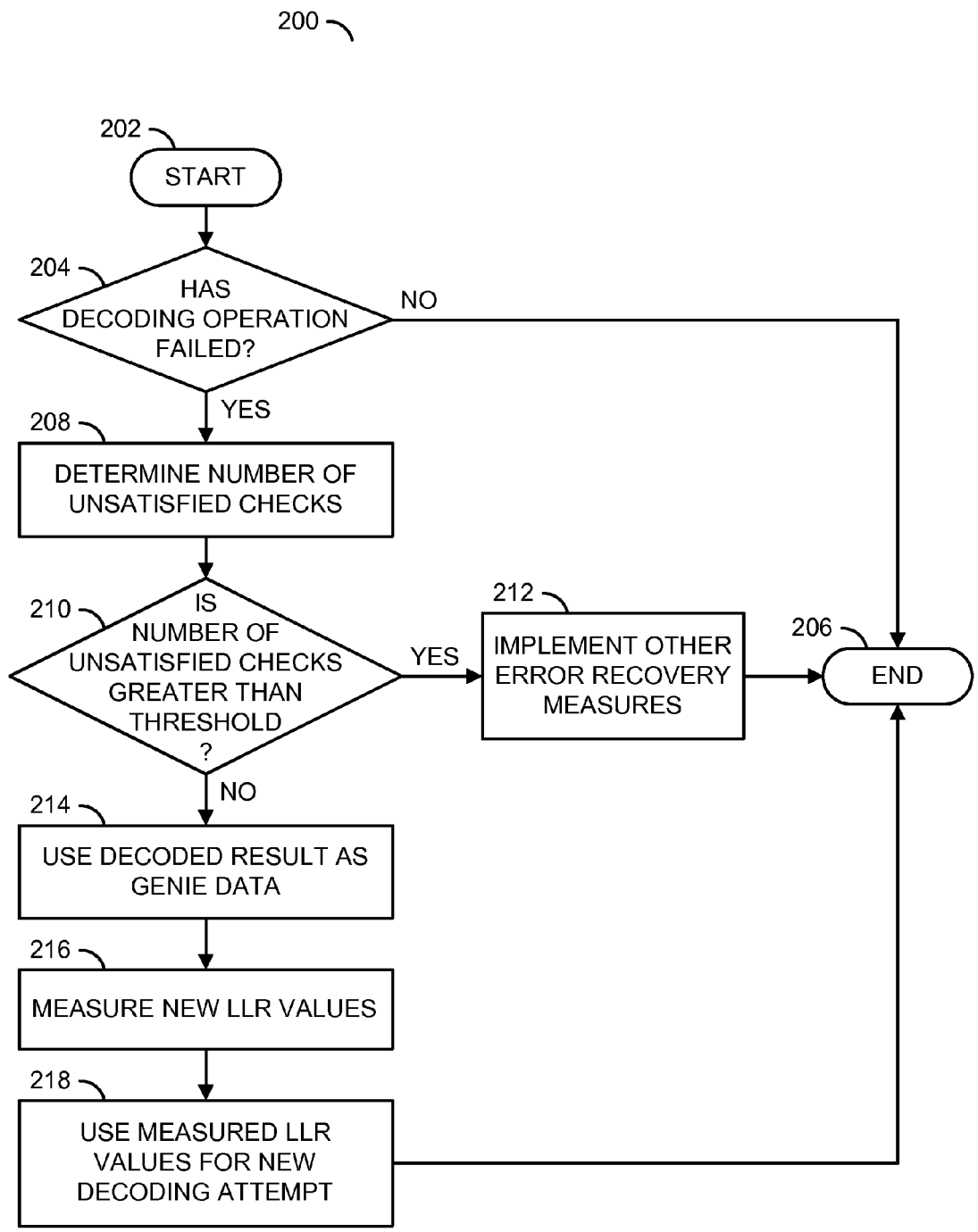
FIG. 7 is a flow diagram illustrating using decoded results as genie data for error recovery.

Referring to FIG. 7, a method (or process) 200 is shown. The method 200 may use decoded results as genie data for error recovery. The method 200 generally comprises a step (or state) 202, a decision step (or state) 204, a step (or state) 206, a step (or state) 208, a decision step (or state) 210, a step (or state) 212, a step (or state) 214, a step (or state) 216, and a step (or state) 218. The state 202 may start the method 200. The decision state 204 may determine if a decoding operation has failed or not. If not, the method 200 moves to the state 206, which ends the method 200. If the decoding operation has failed, the method 200 moves to the state 208. The state 208 determines a number of unsatisfied checks. Next, the method 200 moves to the decision state 210.

The decision state 210 determines whether a number of unsatisfied checks is greater than a threshold. If so, the method 200 moves to the state 212. The state 212 may implement other recovery measures. Next, the method 200 moves to the state 206, which ends the method 200. If the decision state 210 determines the number of unsatisfied checks is not greater than the threshold, the method 200 moves to the state 214. The state 214 uses the decoded results as genie data. Next, the state 216 measures a plurality of new LLR values. Next, the state 218 uses the measured LLR values for a new decoding attempt. Next, the method 200 moves to the state 206, which ends the method 200.

Figure 8:
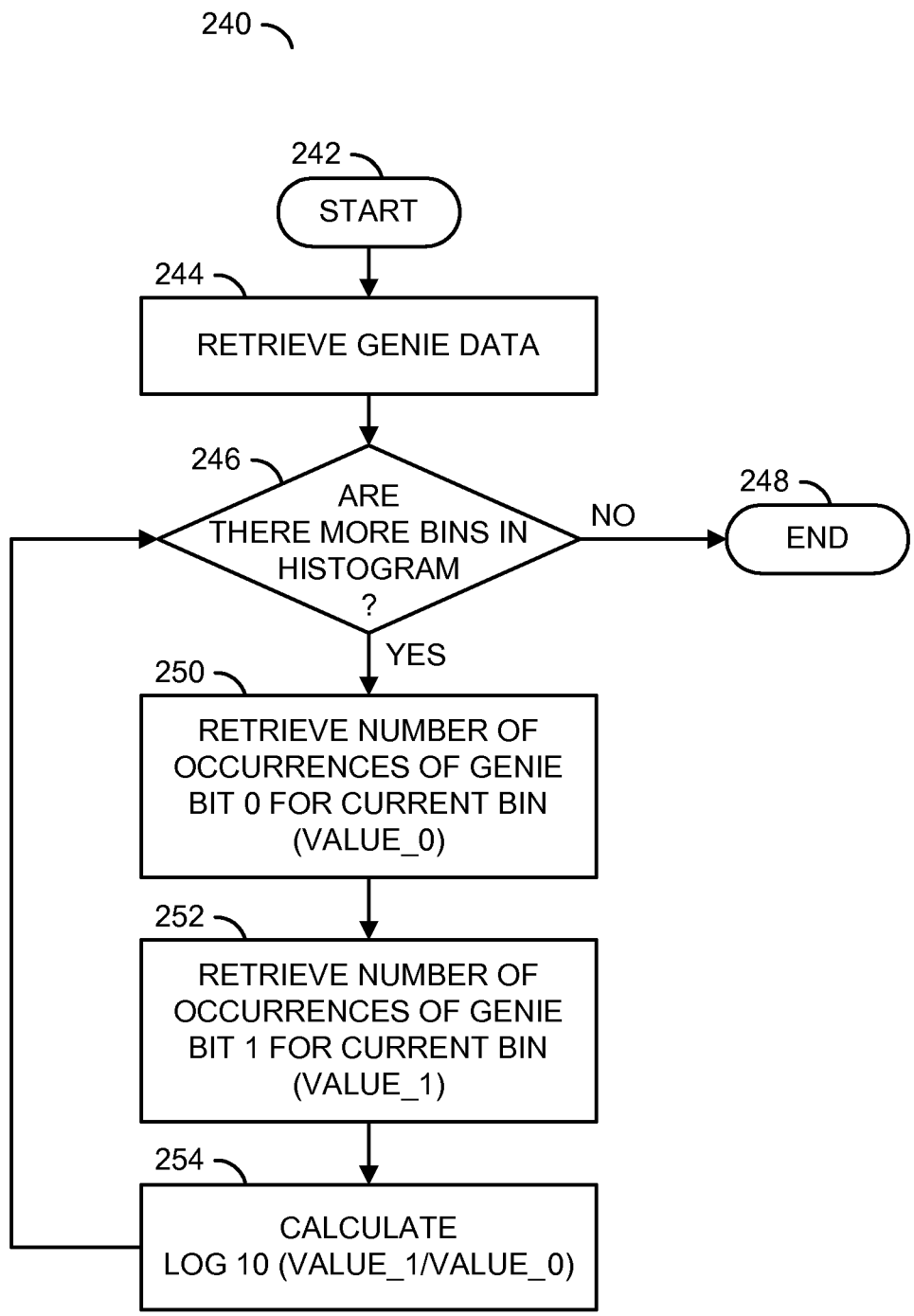
FIG. 8 is a flow diagram illustrating using genie data to determine LLRs for a decision region.

Referring to FIG. 8, a method (or process) 240 is shown. The method 240 may be implemented using genie data to determine LLRs for a decision region. The method 240 generally comprises a step (or state) 242, a step (or state) 244, a decision step (or state) 246, a step (or state) 248, a step (or state) 250, a step (or state) 252, and a step (or state) 254. The state 242 may be a start state. The state 244 may retrieve the genie data. The decision state 246 may determine if there are more bins (e.g., decision regions) in the histogram (e.g., in the LLR histogram 102). If not, the method 240 moves to the state 248 which ends the method 240. If so, the method 240 moves to the state 250. The state 250 retrieves a number of occurrences of the genie bit 0 for a current bin (e.g., VALUE_0). Next, the state 252 retrieves a number of occurrences of the genie bit 1 for the current bin (e.g., VALUE_1). Next, the state 254 calculates a value log 10 (VALUE_1/VALUE_0). The calculated value may be the measured LLR value. The method 240 then returns to the decision state 246.

Figure 9:
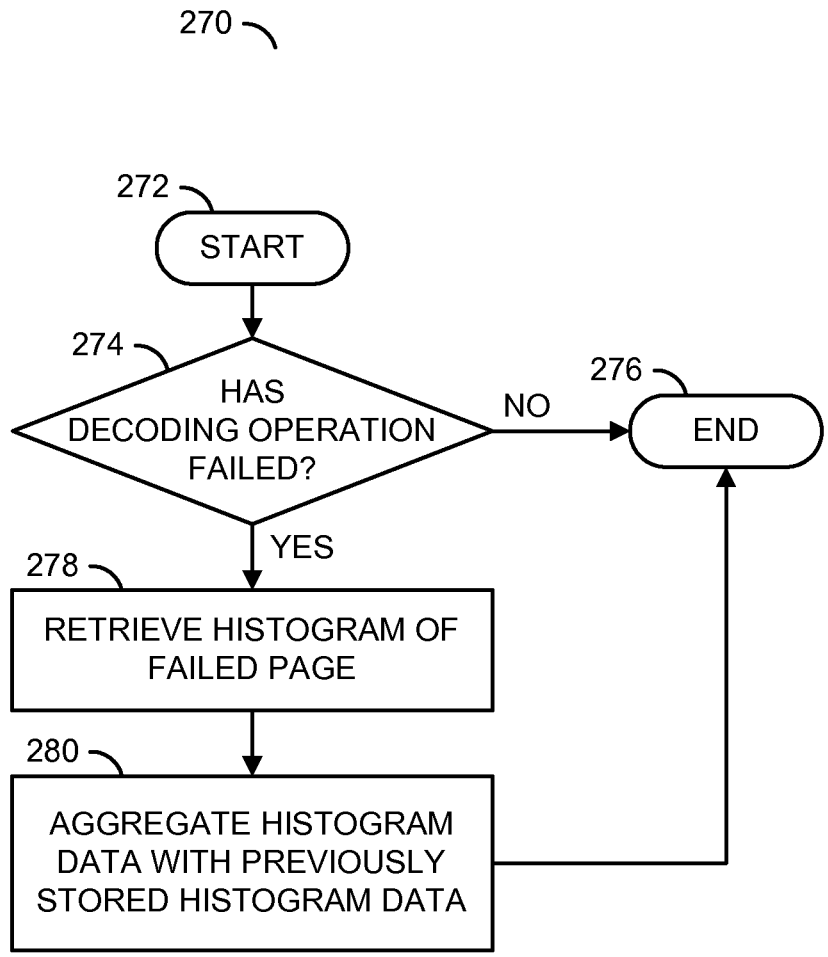
FIG. 9 is a flow diagram illustrating building a histogram based on multiple pages.

Referring to FIG. 9, a method (or process) 270 is shown. The method 270 may implement building a histogram based on multiple pages. The method 270 generally comprises a step (or state) 272, a decision step (or state) 274, a step (or state) 276, a step (or state) 278, and a step (or state) 280. The state 272 may start the method 270. Next, the decision state 274 may determine if a decoding operation has failed. If not, the method 270 moves to the state 276 which ends the method 270. If the decoding operation has failed, the method 270 moves to the state 278. The state 278 retrieves the histogram of the failed page. Next, the state 280 aggregates the histogram data with the previously stored histogram data. The method 270 then moves to the state 276 which ends the method 270.

The controller 70 may implement error recovery. Embodiments of the invention may handle a time-varying property of a flash channel. The time-varying property of the flash channel may be a difficult part of signal processing. The time-varying property of the flash channel may need LLRs to be generated dynamically in order to accommodate the variation of the channel. However, dynamically generating LLRs with good confidence may not be possible without genie data.

Generally, genie data may be binary bits written to a flash media. In conventional flash media, the genie data may not be available unless the ECC decoding is successful. When a page is read from flash, the read data may contain some erroneous bits. However, which bits are erroneous may not be known. Since the erroneous bits are not known, the genie data is not known. The ECC decoding process may correct the erroneous bits so that the genie data may be known. The controller 70 may treat the decoded result from ECC decoding as correct (e.g., genie data).

The controller 70 may use the decoded result from ECC decoding using initial LLR values as genie data. The decoded results used as genie data may contain errors. With genie data, regenerating LLRs by measurement may be implemented using the LLR histogram 102. The new (e.g., regenerated) LLRs may be measured values. Measured LLR values may not rely on assumptions on distributions of cell voltage. With the measured LLRs, uncorrectable bit error rate (BER) may be reduced. The measured LLRs may improve reliability of the SSD 90.

For each read retry, there may be a corresponding LLR LUT. The corresponding LLR LUT may provide a LLR value corresponding to a decision region (e.g., bin). For example, after reading a page, there may be a decision pattern for each cell in the page. The occurrences of decision patterns may be counted, providing a histogram. The histogram may be stored in the LLR histogram 102.

When an initial ECC decoding attempt fails, new (e.g., measured) LLR values may be dynamically regenerated. The decoded results from the initial, failed ECC decoding attempt may be used as genie data. The genie data may be used to measure LLR values based on the histogram. Measured LLR values may be calculated when needed (e.g., when the initial ECC decoding attempt fails). The new, measured LLRs may be used for another decoding attempt.

Measuring new LLR values based on the genie data may be an error recovery method. The error recovery method may be particularly useful for a number of first soft retries. Generally, the first three reads use a larger voltage delta (e.g., a bin width shown in FIG. 6). Many cells may fall into the two middle bins. A small number of erroneous bits may not significantly change the height of the bins (e.g., decision regions). Using the decoding results from a failed initial ECC decoding attempt that may contain a small number of erroneous bits to measure LLR values may obtain close to optimal values. Optimal values may be obtained regardless of how the channel (e.g., voltage distributions) has changed.

Embodiments of the invention may be implemented for error recovery. The controller 70 may need to dynamically measure LLRs. Measurement of new LLRs may need to be performed quickly. The controller 70 may be configured to store LLR histograms (e.g., in the LLR histogram 102).

The measurement of new LLR values may be performed when a decoding operation fails (e.g., decoding performed using an initial LLR value). The decoding result using the initial LLR value may have erroneous bits. The erroneous bits may be treated as if they are correct, since a small number of erroneous bits may not significantly change cell voltage distributions.

The controller 70 may determine if the number of unsatisfied checks is greater than a predefined threshold. The value of the predefined threshold may be determined by experimentation. For example, the predefined threshold may be determined using offline measurements. In another example, the predefined threshold may be updated by a firmware update, and/or updated dynamically over the life of the SSD 90. If the number of unsatisfied checks is greater than the predefined threshold, the controller 70 may perform other error recovery methods. For example, if the number of unsatisfied checks is greater than the predefined threshold the number of erroneous bits in the decoding result from using the initial LLR value may not be small. If the number of unsatisfied checks is less than the predefined threshold, the decoded results from using the initial LLR value may be used as genie data.

The genie data may be used to determine the number of occurrences of bit values in each bin (e.g., decision region) of the histogram. The number VALUE_0 may be the number of occurrences of genie bit 0 for a particular bin. The number VALUE_1 may be the number of occurrences of genie bit 1 for a particular bin. The new/measured LLR value for the bin (e.g., decision region) may be log 10 (VALUE_1/VALUE_0). The measured LLRs may be used in a new decoding attempt.

In some embodiments, the LLR histogram 102 may build the histogram based on multiple pages. Building the histogram based on multiple pages may be more accurate. Building the histogram based on multiple pages may need more effort (e.g., processing). For example, when an attempt decoding fails, the histogram for the page being read may already exist. More pages may be read to gather aggregate (e.g., accumulated) histogram data. Building the histogram based on multiple pages may reduce the effect of the remaining erroneous bits.

The functions performed by the diagrams of FIGS. 7-9 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the specification, as will be apparent to those skilled in the relevant art(s). Appropriate software, firmware, coding, routines, instructions, opcodes, microcode, and/or program modules may readily be prepared by skilled programmers based on the teachings of the disclosure, as will also be apparent to those skilled in the relevant art(s). The software is generally executed from a medium or several media by one or more of the processors of the machine implementation.

The invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The invention thus may also include a computer product which may be a storage medium or media and/or a transmission medium or media including instructions which may be used to program a machine to perform one or more processes or methods in accordance with the invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMs (random access memories), EPROMs (erasable programmable ROMs), EEPROMs (electrically erasable programmable ROMs), UVPROM (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
   a memory configured to store data the memory comprising a plurality of memory units each having a size less than a total size of the memory; and
   a controller configured to (i) process a plurality of read/write operations, (ii) perform a first error correction code decoding on the memory units using a plurality of initial log likelihood ratio values, (iii) count a number of unsatisfied checks if the first error correction code decoding fails, (iv) generate a plurality of measured log likelihood ratio values if the number of unsatisfied checks is below a threshold, wherein the plurality of measured log likelihood ratio values are (a) based on calculations using decoded bits of the first error correction code decoding, and (b) used to perform a second error correction code decoding on the memory units.

2. The apparatus according to claim 1, wherein the decoded bits of the first error correcting code decoding are used as genie data.

3. The apparatus according to claim 2, wherein the decoded bits of the first error correcting code decoding used as the genie data have errors.

4. The apparatus according to claim 1, wherein the controller is further configured to track histograms for the memory units.

5. The apparatus according to claim 4, wherein the plurality of measured log likelihood ratio values are generated using the histograms.

6. The apparatus according to claim 4, wherein the histograms are aggregated based on a plurality of the memory units.

7. The apparatus according to claim 1, wherein the measured log likelihood ratio values are dynamically generated.

8. The apparatus according to claim 1, wherein the number of unsatisfied checks positively correlates to a number of erroneous bits.

9. The apparatus according to claim 8, wherein the erroneous bits are caused by trapping sets.

10. The apparatus according to claim 1, wherein the decoded bits of the first error correction code decoding are treated as correct.

11. The apparatus according to claim 1, wherein the measured log likelihood ratio values handle a time-varying property of the memory.

12. The apparatus according to claim 1, wherein the apparatus reduces an uncorrectable bit error rate.

13. The apparatus according to claim 1, wherein the controller uses the measured log likelihood ratio values for error recovery.

14. The apparatus according to claim 1, wherein the controller is further configured to implement alternate error recovery if the number of unsatisfied checks is above the threshold.

15. The apparatus according to claim 1, wherein the measured log likelihood ratio values are close to optimal even if a voltage distribution of a plurality of cells of the memory units has changed.

16. The apparatus according to claim 1, wherein the apparatus is configured to dynamically update log likelihood ratio values.

17. A method to dynamically update log likelihood ratio values, comprising the steps of:
   configuring a memory to process a plurality of read/write operations, the memory comprising a plurality of memory units each having a size less than a total size of the memory;
   performing a first error correction code decoding on the memory using a plurality of initial log likelihood ratio values;
   counting a number of unsatisfied checks if the first error correction code decoding fails; and
   generating a plurality of measured log likelihood ratio values if the number of unsatisfied checks is below a threshold, wherein the measured plurality of log likelihood ratio values are (a) based on calculations using decoded bits of the first error correction code decoding, and (b) used to perform a second error correction code decoding on the memory.

18. An apparatus comprising:
   an interface configured to process a plurality of read/write operations to/from a memory; and
   a control circuit configured to (i) perform a first error correction code decoding on the memory using a plurality of initial log likelihood ratio values, (ii) count a number of unsatisfied checks if the first error correction code decoding fails, (iii) generate a plurality of measured log likelihood ratio values if the number of unsatisfied checks is below a threshold, wherein the measured plurality of log likelihood ratio values are (a) based on calculations using decoded bits of the first error correction code decoding, and (b) used to perform a second error correction code decoding on the memory.

* * * * *